US 6,638,052 B2

(12) United States Patent
Yunoki et al.

(10) Patent No.: US 6,638,052 B2
(45) Date of Patent: Oct. 28, 2003

(54) DRILLING APPARATUS FOR FLEXIBLE SHEET MADE OF THICK THERMOPLASTIC MATERIAL

(75) Inventors: Akio Yunoki, Toyama-ken (JP); Yasutoshi Nozawa, Toyama-ken (JP); Yutaka Yokoyama, Toyama-ken (JP); Makoto Yamazaki, Toyama-ken (JP)

(73) Assignee: YKK Corporation, Tokyo (JP)

( * ) Notice: Subject to any disclaimer, the term of this patent is extended or adjusted under 35 U.S.C. 154(b) by 190 days.

(21) Appl. No.: 09/811,499

(22) Filed: Mar. 20, 2001

(65) Prior Publication Data

US 2001/0024600 A1 Sep. 27, 2001

(30) Foreign Application Priority Data

Mar. 22, 2000 (JP) .......................... 2000-079515

(51) Int. Cl.[7] .............................................. B29C 59/00
(52) U.S. Cl. .......................................... 425/290; 425/289
(58) Field of Search ................................. 425/289, 290; 264/1.54, 1.55

(56) References Cited

U.S. PATENT DOCUMENTS 5,087,156 A * 2/1992 Kanaya et al. .............. 408/1 R

FOREIGN PATENT DOCUMENTS

NL  7809532 A  *  3/1980
SU  1296530 A1 * 11/1982

* cited by examiner

Primary Examiner—James P. Mackey
Assistant Examiner—Donald Heckenberg
(74) Attorney, Agent, or Firm—Finnegan, Henderson, Farabow, Garrett & Dunner, L.L.P.

(57) ABSTRACT

A drilling apparatus, in which a hole and an insertion hole for a drilling rod are formed at a drilling position of a table and at a sheet pressing member capable of approaching or leaving a surface of the table, respectively, the drilling rod made of metal, capable of rotating at high speeds and reciprocating vertically are inserted through the both holes, the drilling rod has smooth peripheral and front end faces composed of at least part of a circular section having no blade, and a predetermined clearance is provided between the diameters of the hole and the insertion hole and the diameter of the drilling rod, whereby by pressing the drilling rod rotating at high speeds to the sheet, a sheet material is melted by frictional heat so that a beautiful hole is formed.

8 Claims, 6 Drawing Sheets

DRILLING APPARATUS FOR FLEXIBLE SHEET MADE OF THICK THERMOPLASTIC MATERIAL

BACKGROUND OF THE INVENTION

1. Field of the Invention

The present invention relates to a drilling apparatus for flexible sheet made of thick thermoplastic material and more particularly to a drilling apparatus applicable for production of ordinary tightening portion made of thermoplastic woven fabric or synthetic leather, bag belt, webbing for animal, shoelace through portion and the like and not requiring any special post-treatment.

2. Description of the Related Art

According to a conventional technology disclosed in, for example, Japanese Patent Application Laid-Open No. 1-193109, in a drilling process for a printed circuit board made of epoxy resin whose substrate is glass fabric, the printed circuit board is sandwiched between a fixed fitting plate and a pressing plate fixed to a pressure foot which ascends or descends in order to reduce occurrence of burr, chipping, deviation and surface damage. Under this condition, it is intended to drill a hole having a desired diameter with using a drill. In this case, a hole is preliminarily formed in each of the fixed fitting plate and the pressing plate such that the hole has a clearance with respect to the drill.

Further, according to, for example, Japanese Patent Application Laid-Open No. 7-308896, a metallic thin plate, water-soluble lubricant soaked sheet or a sheet formed of polymer layer is placed on a multilayered substrate such as multi-layered printed circuit wiring board in order to ensure heat removal effect, lubrication effect, dispersion preventing effect, and halo phenomenon preventing effect at the time of drilling a through hole by gimlet, drill or punch. Alternatively, the same substrate is sandwiched by the said sheets and then, through holes are drilled in the same substrate together with the sheets.

In recent years, many kinds of thermoplastic fiber fabrics have been used as webbing products for animal girth or strap instead of natural leather. These products have plural holes formed by drilling or punching in the same way as the drilled hole described in the above publication in order to insert a clasp of a buckle. Usually, eyelets are attached to prevent the configuration of these holes from being collapsed. However, because ordinary webbing products are woven using strict thick fibers, fibers cut on an inside face of each hole are likely to be separated loosely from its woven structure so that the eyelet drops out easily, thereby its availability being lost.

Therefore, in order to stabilize the configuration of a formed hole without attaching the eyelet thereto, a drilling apparatus which fuses an inside face of the hole by heat at the same time of drilling has been developed using thermal plasticity of composition material of the webbing products. A basic method for the drilling is to melt the inside face of the hole by heat using a heating rod or ultrasonic wave at the same time when the hole is drilled and leave the face harden.

Because the drilling apparatus described in the above publication is drilling in a multilayered substrate by rotating a gimlet or drill of 0.2 to 0.50 mm in diameter at high speeds of 50,000 to 100,000 rpm, the hole's diameter is very small and necessarily, the position accuracy and processing accuracy are under unit of micron. Further, despite high-speed rotation and heat generation, a rotation with such speed does not generate a high temperature over a melting point of ordinary thermoplastic resin. Therefore, applying such drilling technology to the webbing products made of thermoplastic material, just as it is, is meaningless and substantially impossible.

On the other hand, if it is intended to drill a hole in the webbing products using the above-mentioned heating rod or ultrasonic wave, its processing speed is decreased and productivity also drops. Further, the inside face of the formed hole is not smooth face but there remains a melting mark and melting chips adhere to a peripheral edge of the hole, so that the peripheral edge of the hole is locally swollen and a beautiful hole's configuration is difficult to secure.

SUMMARY OF THE INVENTION

The invention has been achieved to solve the above described problems and an object of the invention is to provide a drilling apparatus capable of obtaining a beautiful hole's configuration with stability in a sheet, which is made of flexible thermoplastic material being different from a strict material used such as a printed circuit wiring substrate but a thick material, without special post-treatment, and ensuring a high productivity.

A sheet material which is a processing object of the invention is different from a ordinary strict plate having a low viscosity and an excellent workability such as metal and electronic parts. For example, the sheet material is composed of fiber woven fabric, fiber knitted fabric, unwoven fabric or thick thermoplastic resin material, in which thermoplastic resin is soaked, having a flexibility and difficult to machine because its viscosity is increased by a heat generated during machining.

As described above, the drilling apparatus of the invention is demanded to form a hole in the said sheet material so that the configuration of the hole is not collapsed bearing a long term use without any special treatment after drilling is made and an inside face and peripheral portion of the hole are processed beautiful.

As a result of accumulated considerations based on these premises, inventors of this invention recognized that it was necessary to develop technology, in which an inside face of the hole is melted at the same time of drilling and further no melting chips adheres to the periphery of the hole. Basically, drilling with a rotation drill which makes a sliding contact with an inside face of the hole is preferable in view of efficiency and it is preferred that the inside face of the hole can be melted at the same time.

Then, the inventors drilled in synthetic resin (nylon) being composition material of webbing products by rotating a drill of an ordinary vertical drilling machine while heating the material over a melting temperature thereof. Consequently, although an inside face of the formed hole had somewhat smoothness, melting chips adhered to the peripheral edge of the hole on a rear face in the drilling direction and further, the peripheral edge portion on the same rear face was swollen outward. Still further, because the melting resin were hardened to be adhered to blade grooves of the drill and piled, continuous drilling for a long time was disabled. The phenomenon that the melting resin were hardened to be adhered to the blade groove and piled occurred also when drilling in the front and rear faces of a drilling region of the webbing products sandwiched by a fixed fitting plate and a pressing plate as disclosed in the above-mentioned Japanese Patent Application Laid-Open No. 1-193109 by means of a heating drill. In this case, melting resin which could not escape adhered to the blade groove, so that the frequency of continuous drilling decreased by contraries.

Therefore, a conclusion that drilling with a heating drill having an ordinary configuration could not attain its practical purpose was reached. As a result of further trial processing, when a rod having a simple circular section was used by removing the blade from the drill and canceling positive heating, and feeding speed and rotation speed were set to appropriate values, the inside face of a hole was formed in equally fused smooth surface. Further, no melting chips adhered to the front and rear faces around a peripheral portion of the hole formed in the webbing tape and the peripheral portion of the hole on the rear face was not swollen. Consequently, a very beautiful hole having a stabilized configuration was obtained by accident.

Accordingly, the invention has been achieved based on the above described finding. Therefore, according to a main aspect of the invention, there is provided a drilling apparatus for flexible sheet made of thick thermoplastic resin material, comprising: a table containing a hole having a predetermined diameter at a drilling position thereof for the sheet; a drilling rod made of metal capable of rotating at high speeds while a rotation center line of the drilling rod reciprocating along a center line of the hole between inside of the hole and above the table; and a sheet pressing member disposed above the table and having an insertion hole for the drilling rod, the sheet pressing member being capable of approaching or leaving the surface of the table, wherein the drilling rod has a flat peripheral face composed of at least part of a circular section having no blade and a predetermined clearance is provided between the diameters of the hole and the insertion hole and the diameter of the drilling rod.

After the flexible sheet is placed on a table, the sheet pressing member is approached to the table and the same sheet is sandwiched with pressure between the table surface and a rear face of the sheet pressing member. Next, the drilling rod is actuated at a predetermined rotation speed and feeding speed determined depending on thermoplastic material so as to drill. At this time, frictional heat is generated between the drilling rod and sheet, so that a drilling face of the sheet in a sliding contact with the drilling rod is heated over a melting temperature and consequently melted. The melted material penetrates an inside of the sheet and a melting film is formed on the sliding contact face with the drilling rod when a hole is formed.

If the said clearance is set to an appropriate value, a sheet material melted at the time of drilling is sealed between the table and the sheet pressing member, so that the melted sheet material invades into an inside of the sheet by pressing force and centrifugal force of the drilling rod as described above. Therefore, after the drilling is completed, no melting chips swells out on the front and rear surfaces of the tape. Moreover, the inside face of the hole is adhered by the melting material and smoothed by a peripheral face of the drilling rod. Consequently, the hole is finished very beautiful and stability of the hole configuration is maintained with long-term use.

Preferably, it is specified that a peripheral speed of the drilling rod at the time of rotating is 450 to 1,000 cm/sec. The reason why not the rotation speed of the drilling rod but the peripheral speed at the time of the rotating is employed is that if the diameter of the rod is changed, a sliding speed of the drilling rod being in sliding contact with the sheet is changed. If the peripheral speed at the time of rotating of the drilling rod is smaller than 450 cm/sec, melting of the sheet material by frictional heat is not carried out, so that durability of the hole configuration drops. Further, if the said peripheral speed exceeds 1,000 cm/sec, melting width is increased so that no stabilized hole configuration can be secured.

Further preferably, it is specified that feeding speed of the drilling rod to the flexible sheet is 0.5 to 2 cm/min. This feeding speed is deeply related to pressing force to the sheet. If this feeding speed is smaller than 0.5 cm/min, melting amount on a sliding face of the sheet deviates so that processing efficiency drops and the hole configuration is not stabilized. If the feeding speed exceeds 2.0 cm/min, a strong pressing force is generated before the sliding contact face of the sheet is melted. Consequently, frictional heat largely exceeding the melting temperature is generated, so that a desired hole configuration can not obtained.

Still further, it is specified that a front end face of the drilling rod is a curved face protruded outward. And it is specified that the front end face of the drilling rod is a flat face. And it is also specified that the front end face of the drilling rod is a pair of flat faces each surrounded by part of circle and chord, the pair of the flat faces opposing each other at a predetermined distance. The inventors considered the configuration of the drilling rod in various ways to facilitate pressing of the drilling rod into the sheet. For example, the inventors considered formation of a cylindrical blade having a rod end dented inward with its periphery remaining. As a result of drilling with this rod, it was found that the hole configuration was stabilized so that it could bear drilling of several times and however, cutting chips were deposited inside the cylindrical blade at a rod end face gradually, thereby making the blade portion likely to be broken. However, this is sufficiently available for drilling of a small number of holes. This can be said for the third configuration of the front end face of the drilling rod mentioned above.

Then, as a result of accumulated considerations about the configuration of the blade, in case of using an ordinary shape of a drill, cutting chips or melting chips were piled and hardened in a pocket portion of a blade tip so that the drill could not bear a long term use. A most preferred embodiment of the invention was found by accident through the continued experiments. According to the rod configuration of this embodiment, a simple round bar having a flat front end face of the rod or a bar having a protruded semi-spherical head is employed. Consequently, in a hole formed by this drilling rod, the peripheral edge portion around the hole on the front and rear surface is very beautiful and an inside face of the hole is fused and hardened firmly. Further, a hole having a diameter of 4.6 mm can be drilled in substantially 2.0 sec in case of a webbing tape made of nylon fiber fabric, for example, although the drilling speed is different depending on material. The life of the drilling rod is quite longer than that of a conventional drill.

Preferably, it is specified that the drilling rod is comprised of a main body having the same diameter as the diameter of a hole to be formed and a protruded portion protruded from a front end of the main body along the center line and having a diameter smaller than the diameter of the main body. This rod is suitable for forming a hole having a large diameter. Upon drilling operation, first, a hole having a small diameter is formed by the protruded portion and then, a desired hole is formed subsequently by the diameter of the main body. Consequently, the peripheral edge portion around the hole both on the front and rear faces is beautiful in case of the hole having the large diameter as well as the hole having the small diameter and the inside face of the hole is fused and hardened firmly.

Further preferably, it is specified that clearance formed between a hole formed in the table and the diameters of a rod insertion hole formed in the sheet pressing member and the drilling rod is 0.1 to 0.3 mm. If the said clearance is smaller than 0.1 mm, the drilling rod is likely to interfere with the table or sheet pressing member due to vibration of the apparatus or the like. If the clearance exceeds 0.3 mm, melting chips are likely to adhere to the peripheral edge of the hole formed in the sheet, so that a stabilized beautiful hole configuration cannot be secured.

DESCRIPTION OF THE PREFERRED EMBODIMENTS

Hereinafter, a drilling apparatus for a webbing tape according to a typical preferred embodiment of the invention will be described in detail with reference to the accompanying drawings. The example shown here indicates a typical example of the invention, which can be applied to a drilling apparatus for a thick but flexible sheet, for example, synthetic leather made of thermoplastic synthetic resin, as well as webbing tape.

Figure 1:
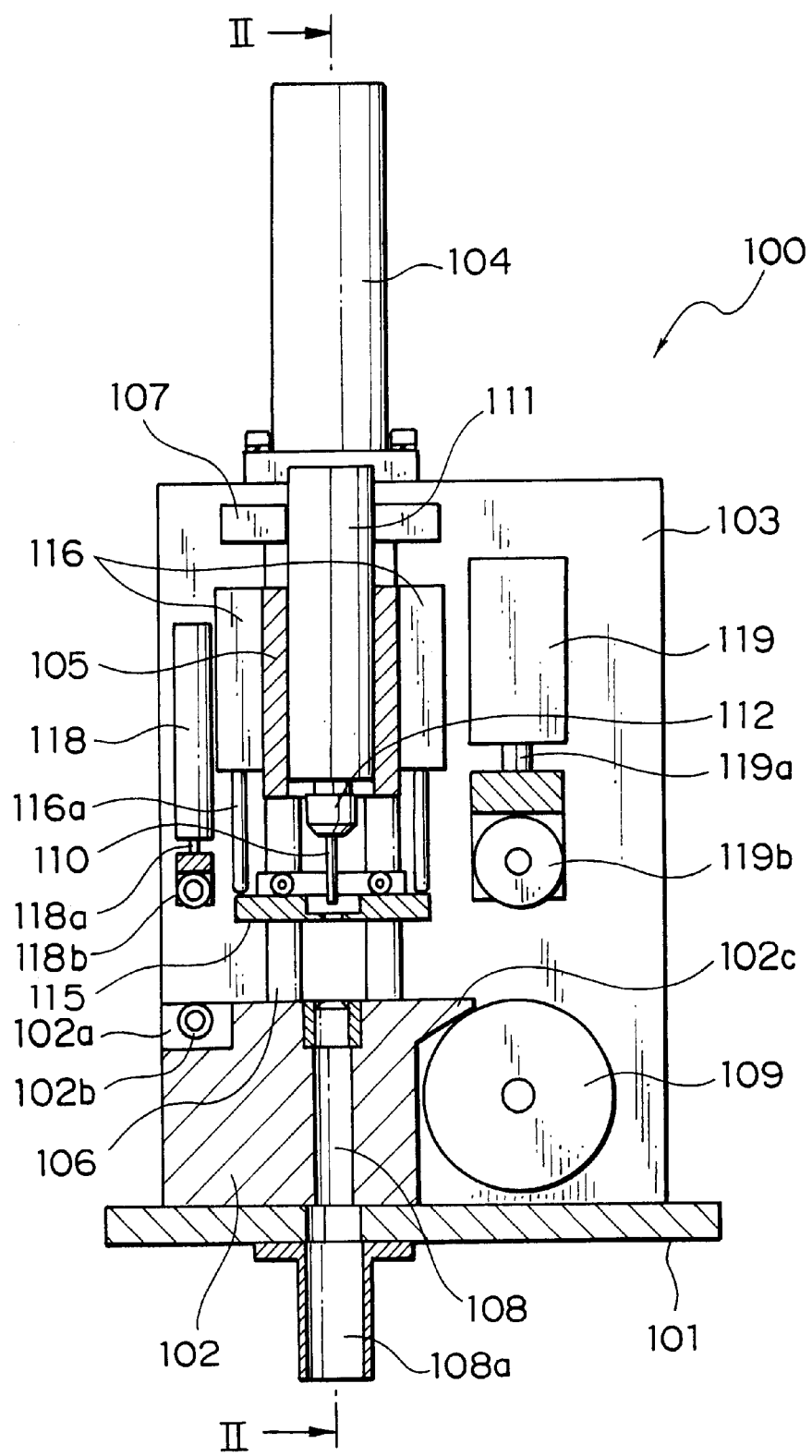
FIG. 1 is a schematic sectional view of a main portion of a drilling apparatus as viewed from a front thereof according to a typical embodiment of the invention.
Figure 2:
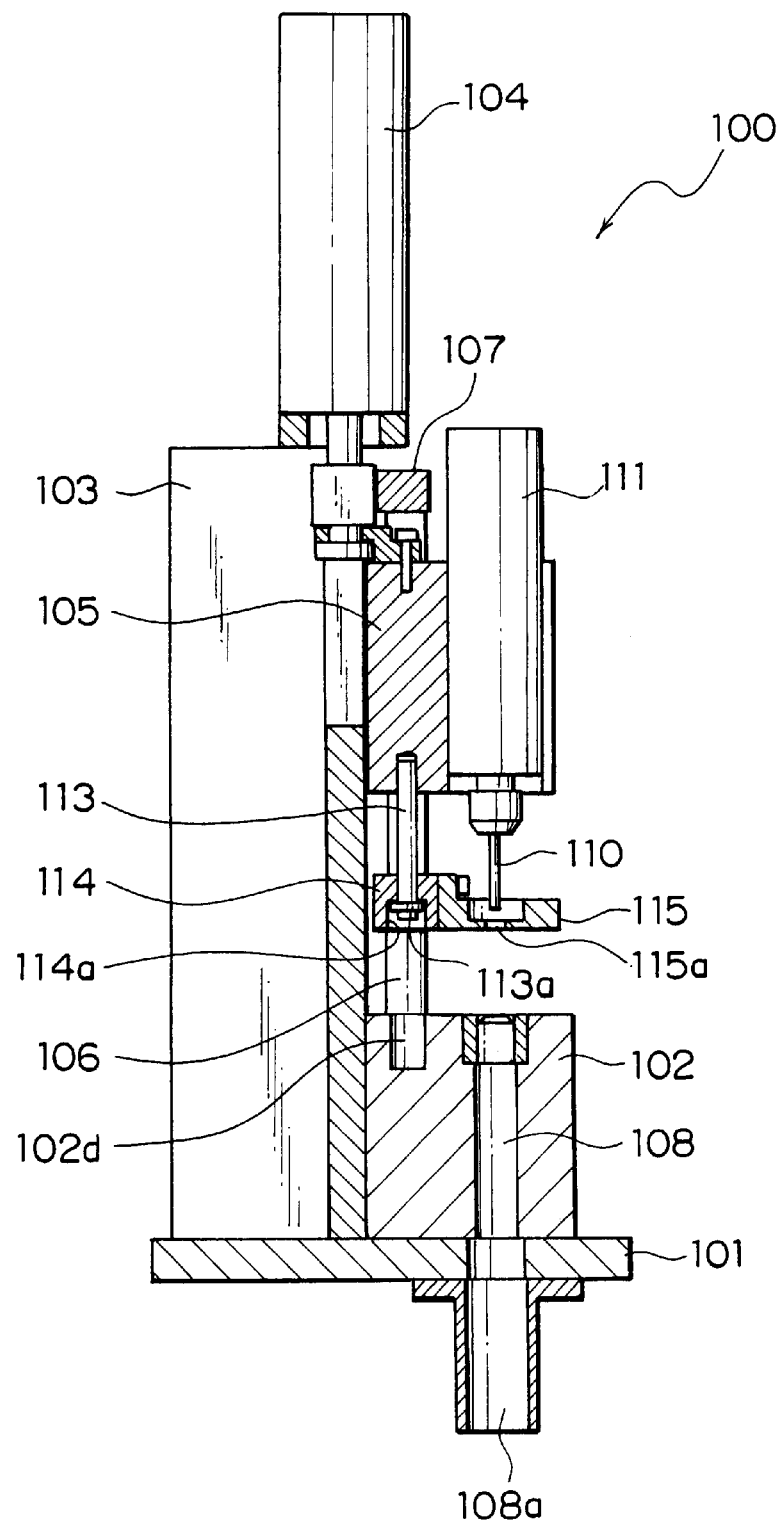
FIG. 2 is a sectional view taken along the line II—II of FIG. 1.

FIG. 1 is a schematic sectional view of a main portion of a drilling apparatus as viewed from a front thereof according to a typical embodiment of the invention. FIG. 2 is a sectional view taken along the line II—II of FIG. 1.

In the drilling apparatus 100 for webbing tape of this embodiment, a table 102 is provided to be fixed on a bed 101 and a frame 103 is provided to be stood on a back face of the same table 102. A lift cylinder 104 of the drilling rod 110 is provided to be fixed at a top end of the said frame 103 and a lift block 105 is fixed to an end of a cylinder rod of this rod lift cylinder 104. A pair of lift block guide bars 106, which are right and left when viewed from front, are disposed on a front face of the frame 103. A top end of each guide bar 106 is fixed and supported by a guide bar supporter 107 attached to a front face of the frame 103 and a bottom end of each guide bar 106 is fixed and supported by said table 102.

A sliding hole through which the said guide bars 106 are inserted is provided through the lift block 105. Thus, the lift block 105 is lifted up and down between a top waiting position and a drilling position by operation of the block lift cylinder 104 while guided by the guide bars 106.

A rod rotation driving motor 111 for rotating the drilling rod 110 is provided to be fixed in the center of the lift block 105 in the right and left direction. Then, the drilling rod 110 is attached detachably to a rod chuck 112 fixed to an output shaft of the motor 111. Further, a connecting member 114 is joined to a bottom of the lift block 105 through a connecting pin 113. A tape pressing plate 115 is fixed horizontally at a position intersecting lift motion of the drilling rod 110 with bolts on a front face of the connecting member 114.

Figure 6A:
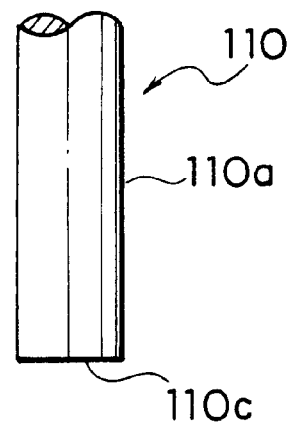
FIGS. 6a–6b is an explanatory drawing for explaining the structure of a drilling rod used in the embodiment of FIG. 1.
Figure 6B:
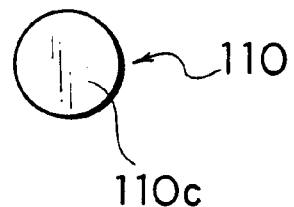

The drilling rod 110 employed in this embodiment is just a round bar having a smooth peripheral face and the same diameter as shown in FIG. 6. A front end face of a rod main body 110a is just a simply flat face 110c. This drilling rod 110 is used for drilling a small hole. If this drilling rod 110 employs a general shape of a drill having a blade portion on its peripheral face, cutting chips or melting chips are adhered to a pocket portion of the blade portion and piled when drilling, so that a blade tip is damaged soon or a hole having beautiful and stabilized configuration cannot be formed.

Figure 7:
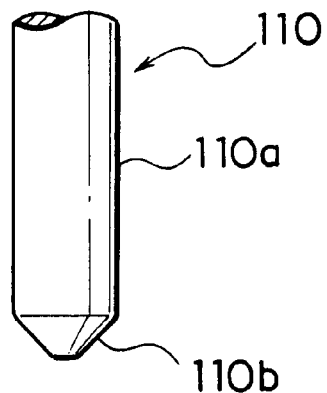
FIG. 7 is an explanatory drawing for explaining other preferred structure of a drilling rod used in the invention.

However, the configuration of the drilling rod 110 of the invention is not restricted to the said configuration, but for example, as shown in FIG. 7, the tip of the rod main body 110a having a circular section may be formed so as to be protruded outward as a curved face 110b. If this drilling rod 110 is used for drilling operation, the tip portion of the curved face 110b rotating quickly bites a flexible sheet first of all, and frictional heat generated at this time melts the flexible sheet gradually in the diameter direction of the rod so as to form a hole.

Figure 8A:
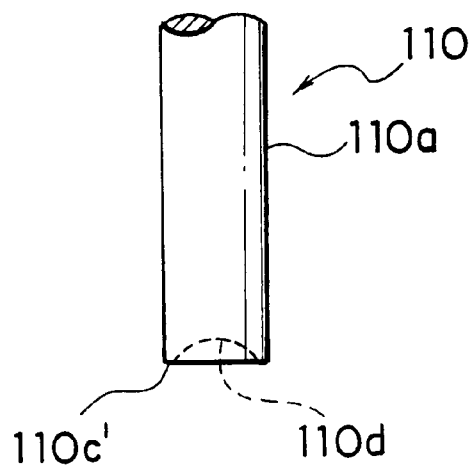
FIGS. 8a–8b is an explanatory drawing for explaining a modification of the drilling rod used in the invention.
Figure 8B:
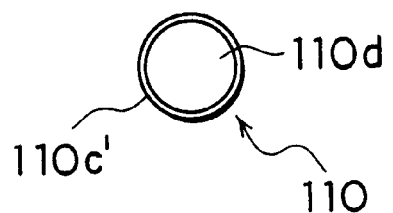

It is permissible to form a concave portion 110d curved inward in the shape of an arc in the center of the rod end face while a slight amount of a flat portion 110c' remaining on the peripheral edge of a front end of the rod main body 110a as shown in FIG. 8. If the front end face of the drilling rod 110 is flat, drilling into the flexible sheet is carried out positively by the peripheral edge of the rod having the highest peripheral speed. Thus, the center portion of the front end of the rod does not always have to make contact with the sheet. With this drilling rod 110, the said flat portion 110C' makes contact with the sheet while rotating quickly at the time of drilling and the sheet is locally melted by frictional heat generated at that time. Consequently, drilling is carried out while melting chips removed by the drilling is introduced into the concave portion 110d.

Because there is such a fear that the melting chips of the sheet may be adhered to be piled and hardened in the concave portion 110d so that it may be damaged despite a short period use, the flat face 110c' is kept on the peripheral edge so as to keep front end of the rod thick thereby preventing the rod from being broken. At this time, it is preferable that the melting chips adhering to the concave portion 110d are removed by removing means properly. As removing means for this melting chips may be a scraper which is disposed to oppose the end face of the rod when the drilling is finished and having substantially the same arc-shaped face as the said concave portion 110d.

According to other configuration of the drilling rod 110, it is permissible to provide with a plate piece (not shown), having a width equal to the hole diameter, to protrude from a front end of the rod main body 110a and cut out a tip portion of the plate in the shape of V letter. At that time, an end face in the width direction of the plate piece may be formed of a somewhat rough face.

Figure 9A:
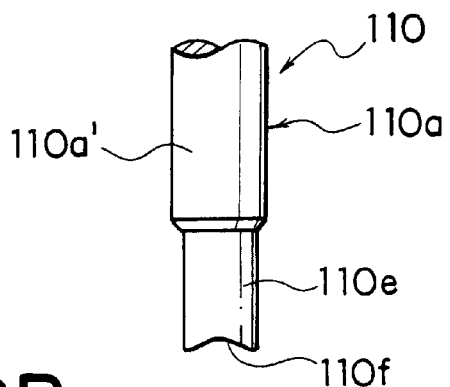
FIGS. 9a–9b is an explanatory drawing for explaining other modification of the drilling rod used in the invention.
Figure 9B:
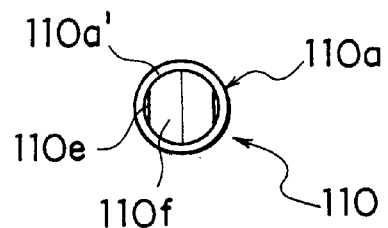

Further, it is also permissible to provide the front end of the rod with a round bar 110e having a smaller diameter than that of a main portion 110a' of the rod main body 110a as shown in FIG. 9 so as to protrude and then provide a tip thereof with a notch portion 110f cut in the shape of V letter. If a large diameter hole is made in the flexible sheet, an area in which the front end of the rod comes into contact with the sheet is increased, so that large loads are applied to both of the front end of the rod and the sheet thereby providing a possibility that the rod may be damaged or a hole may be formed in a deformed shape. According to this embodiment as well as the embodiment shown in FIG. 8, it is permissible to provide with the sheet piece whose tip is cut in the shape of V letter, having a width smaller than the diameter of the main body 110a'instead of the round bar 110e.

According to this drilling rod 110, upon drilling operation, first, the said round bar 110e comes into contact with the sheet and makes a hole smaller than a predetermined diameter. After that, the rod main body 110a comes into contact with the sheet and makes a hole having the predetermined diameter. The notch portion 110f functions as same as the concave portion 110d shown in FIG. 8. Because a front end portion of the round bar 110e is open in the diameter direction unlike the concave portion 110d, melting chips can be discharged out of the notch portion 110f through this opening, so that such an event that melting chips are piled and hardened inside the notch portion 110f to damage the rod never occurs.

Figure 10A:
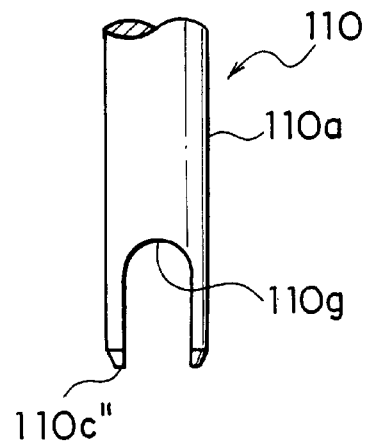
FIGS. 10a–10b is an explanatory drawing for explaining still other modification of the drilling rod used in the invention.
Figure 10B:
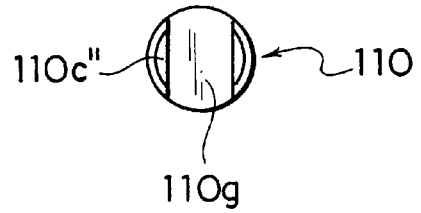

Further, it is also permissible to provide opposing peripheral edge portions at the rod front end with flat portions 110c" surrounded by arc and chord such that a U-shaped groove portion 110g is provided between those flat portions 110c" shown in FIG. 10. This drilling rod 110 is also used for making a large hole in the flexible sheet. Upon drilling operation, the flat portions 110c' comes into contact with the sheet so as to melt the sheet and can positively discharge melting chips of the sheet generated by the drilling into the groove portion 110g. Because the groove portion 110g is open in the diameter direction of the rod main body 110a, the melting chips can be discharged out of the groove portion 110g through this opening, so that the melting chips are not piled or hardened in the groove portion 110g thereby not leading to damage of the rod 100. Further, a hole having a predetermined diameter can be formed in a single process.

A top end of the connecting pin 113 is fixed to a bottom face of the lift block 105. A bottom end of the same pin 113 is inserted through a pin insertion hole 114a formed in the connecting member 114, so that the connecting member 114 is allowed to slide up/down over a predetermined distance along the connecting pin 113. Thus, a lower half portion of the pin insertion hole 114a formed in the connecting member 114 has a large diameter through a step and a bottom end of the connecting pin 113 has a flange 113a which engages with the step.

Further, according to this embodiment, air cylinders 116 are provided to be fixed on the right and left sides of the lift block 105 such that a bottom end of each of the cylinder rods 116a opposes a top face of the said tape pressing plate 115. Meanwhile, according to the invention, a pressing spring may be employed instead of the air cylinder 116.

A rod insertion hole 115a is formed at a position opposing the drilling rod 110 of the tape pressing plate 115. The diameter of this rod insertion hole 115a is set up slightly larger than that of the drilling rod 110 so that there is provided a clearance. According to this embodiment, the diameter of the drilling rod 110 is 4.6 mm, the diameter of the rod insertion hole 115a is 4.8 mm and the clearance is set to 0.2 mm. Although this clearance is changed depending on the material of the tape or the diameter of the drilling rod 110, generally, it is preferred to be in a range of 0.1 to 0.3 mm to ensure stability of processing and prevent melting chips from adhering to the peripheral edge of the hole.

On the other hand, a through hole 108 is formed at a position, where the drilling rod 110 descends, of the said table 102 and bed 101. An upper end portion of this through hole 108 is a tapered face whose diameter gradually decreases as it goes upward. The diameter of its opening coincides with the diameter of the rod drilling hole 115a and a lower opening of the through hole 108 is connected to a chip discharging passage 108a.

A square cut-out portion 102a is formed in a top face on the left end of the table 102 and a guide roller 102b is attached in the cut-out portion 102a. A eaves portion 102c in which a bottom face thereof is a tapered face inclined upward toward outside is provided to be extended on a top portion on the right end of the table 102. A tape feed driving roller 109 having a large diameter is supported rotatably by the said frame 103 below this eaves portion 102c. The guide roller 102b and the tape feed driving roller 109 are supported such that top ends of the peripheral faces thereof are on the same plane as the top face of the table 102.

First and second pressing roller lift cylinders 118 and 119 are provided to be fixed above the guide roller 102b and the tape feed driving roller 109 being on the frame 103 such that they oppose respectively. First and second pressing rollers 118b and 119b are supported rotatably at end portions of cylinder rods 118a and 119a.

A drilling process with the drilling apparatus 100 for the webbing tape of this embodiment having the above described structure will be described with reference to FIGS. 1, 3 to 5.

Figure 3:
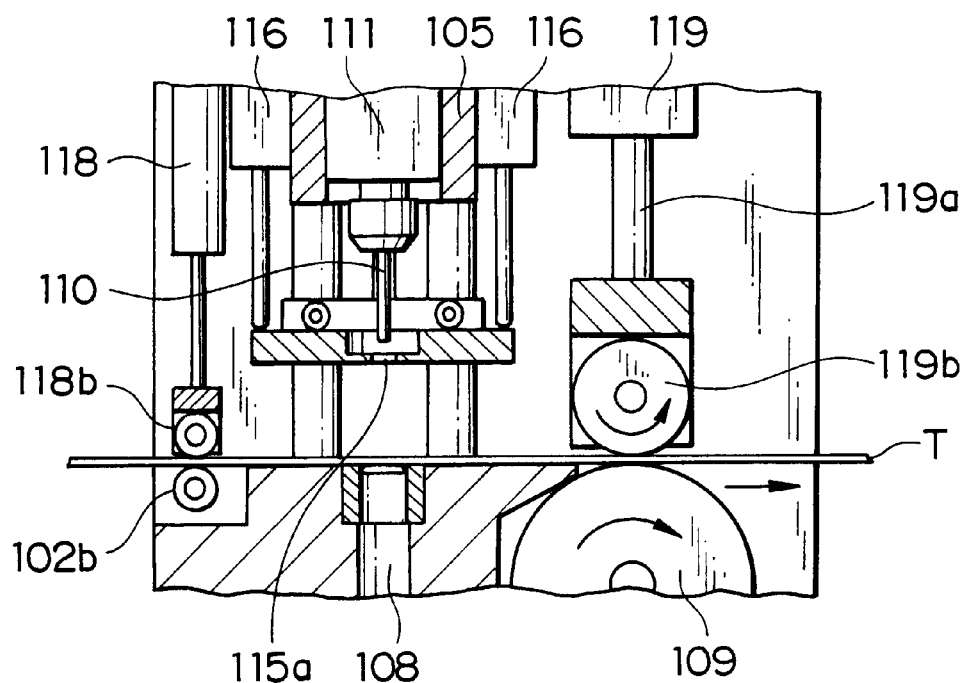
FIG. 3 is an explanatory drawing for explaining an operation for feeding a webbing tape in the drilling apparatus of FIG. 1.

If a long webbing tape T is placed on a drilling position of the table 102 when the drilling apparatus is in waiting condition as shown in FIG. 1, the first and second pressing roller lift cylinders 118 and 119 are actuated, so that as shown in FIG. 3, the first and second pressing rollers 118b and 119b are descended so as to sandwich the webbing tape T. Here, the tape feed driving roller 109 is driven and rotated so as to feed a drilled portion of the same tape up to the drilling position and after the positioning is completed, the rotation is stopped.

Figure 4:
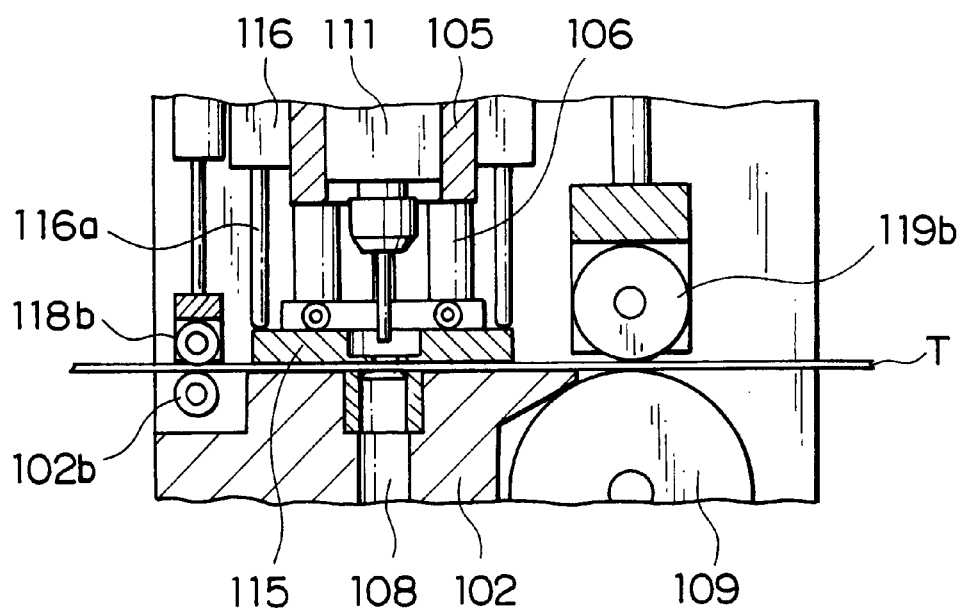
FIG. 4 is an explanatory drawing for explaining a starting operation of drilling in the apparatus of FIG. 1.
Figure 5:
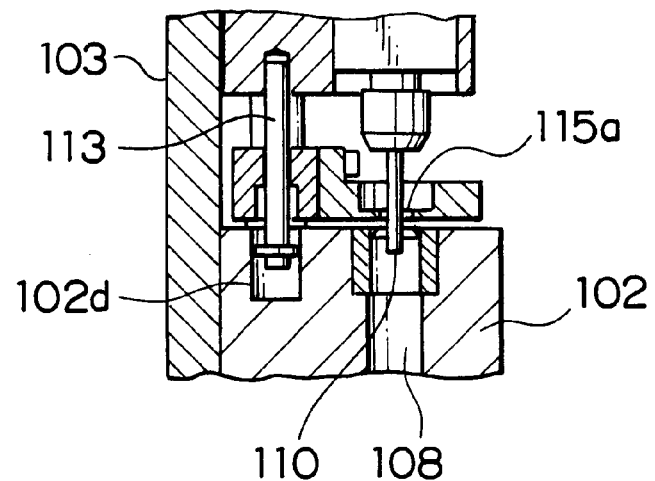
FIG. 5 is an explanatory drawing for explaining an operation for drilling in the apparatus of FIG. 1.

Next, the rod lift cylinder 104 is actuated, so that as shown in FIG. 4, the lift block 105 is descended. With this descent of the lift block, the drilling rod 110 is descended together with the rod rotation driving motor 111. At this time, the connecting pin 113 provided to be suspended from the bottom face of the lift block 105 is also descended and the tape pressing plate 115 fixed to the connecting member 114 engaging with the bottom end of this connecting pin 113 is also descended. If the tape pressing plate 115 comes into contact with a top face of the webbing tape T, the tape pressing plate 115 is stopped there. However, only the connecting pin 113 continues to be descended and invades into a concave groove portion 102d formed in part of the top face of the table 102.

At the same time when the rod lift cylinder 104 is actuated, the rod rotation driving motor 111 is also actuated so as to rotate the drilling rod 110. According to this embodiment, the rotation speed of the drilling rod 110 is set to 20,000 rpm. Because the diameter of the drilling rod 110 is 4.6 mm, a peripheral speed of the drilling rod 110 is as high as 480 cm/sec. Meanwhile, the peripheral speed of a drill if actuated to drill disclosed in the said Japanese Patent Application Laid-Open No. 7-308896 is only 26.17 cm/sec when the rotation speed is 100,000 rpm under a drill diameter of 0.5 mm.

At the same time when the tape pressing plate 115 comes into contact with the webbing tape T, the air cylinders 116 are actuated so that the tape pressing plate 115 is pressed against the tape T at a predetermined pressing force by the cylinder rod end so as to hold the tape T. At this time, the front end of the drilling rod 110 is rotated quickly and penetrates through the rod insertion hole 115a in the tape pressing plate 115. Consequently, the webbing tape T is drilled so that the drilling is completed in only two seconds. On the other hand, the bottom end of the connecting pin 113 continues to be descended in the concave groove portion 102d until the drilling is completed.

As for the configuration of a hole formed by the drilling apparatus according to this embodiment, a flat melting film is formed on its inside peripheral face and further, part of the melting substance penetrates into between fibers composing the tape and hardens there thereby stabilizing the configuration of the hole and maintain the configuration of the hole despite a long-term use. Further, no swelling portion is formed of the melted material on front and rear surfaces around the peripheral end of the hole, so that a very beautiful hole configuration is formed.

Such a beautiful, stabilized hole can not be achieved unless the drilling rod 110 is formed in the above described configuration, the rotation speed is increased as described above, the front and rear surfaces of the webbing tape T are sandwiched by the table 102 and tape pressing plate 115 when drilling or the feeding speed of the drilling rod 110 is set to an appropriate speed.

That is, when the drilling rod 110 is rotated at the above described rotation speed and pressed into the tape T, the contact surface is heated over a melting temperature by frictional heat so that the surface is melted and a beautiful melting film is formed on an inside surface of the hole. Because the peripheral edge portion around the hole is sandwiched strongly by the table 102 and the tape pressing plate 115, the hole is not deformed by a pressing force of the drilling rod 110. Further because the clearance between the drilling rod 110 and the rod insertion hole formed in each of the table 102 and tape pressing plate 115 is so small, melted composition material does not go out of the clearance or adhere to the front and rear surface of the peripheral edge portion around the hole edge. Meanwhile, under the peripheral speed at the time of drilling described in the Japanese Patent Application Laid-Open No. 7-308896, an increase of temperature by frictional heat is so small that no melting film is formed.

Such operation and effect are not restricted to the above described embodiments, but the same operation and effect can be attained in drilling synthetic leather and the like formed by soaking thermoplastic synthetic resin in, for example, very thin thermoplastic synthetic fiber unwoven fabric so that both are integrated.

What is claimed is:

1. A drilling apparatus for flexible sheet made of thick thermoplastic resin material, comprising:

a table containing a hole having a predetermined diameter at a drilling position thereof for said sheet;

a drilling rod made of metal capable of rotating at high speeds while a rotation center line of said drilling rod reciprocating along a center line of said hole between inside of said hole and above said table; and a sheet pressing member disposed above said table and having an insertion hole for said drilling rod, said sheet pressing member being capable of approaching and leaving the surface of the table, wherein said drilling rod has smooth peripheral and front end faces composed of at least part of a circular section having no blade and wherein a predetermined clearance is provided between diameters of the hole and the insertion hole and a diameter of the drilling rod.

2. A drilling apparatus according to claim 1, wherein the drilling rod is capable of a peripheral speed at the time of rotation of 450 to 1,000 cm/sec.

3. A drilling apparatus according to claim 1, wherein the drilling rod for said flexible sheet is capable of being fed at a speed of 0.5 to 2 cm/min.

4. A drilling apparatus according to claim 1, wherein a front end portion of said drilling rod is composed of a curved face protruded outward.

5. A drilling apparatus according to claim 1, wherein the front end face of said drilling rod is a plane face.

6. A drilling apparatus according to claim 1, wherein the front end face of said drilling rod is composed of a pair of flat faces each surrounded by part of circle and chord, the pair of the flat faces opposing each other at a predetermined distance.

7. A drilling apparatus according to claim 1, wherein said drilling rod is comprised of a main portion having the same diameter as the diameter of a hole to be formed and a protruded portion protruded from a front end of said main portion along the center line and having a diameter smaller than the diameter of said main portion.

8. A drilling apparatus according to claim 1, wherein the clearance provided between the diameters of the hole formed in said table and the insertion hole for said drilling rod formed in the sheet pressing member and the diameter of said drilling rod is 0.1 to 0.3 mm.

* * * * *